(12) United States Patent
Liou (10) Patent No.: US 11,362,637 B2
(45) Date of Patent: Jun. 14, 2022

(54) BULK ACOUSTIC WAVE STRUCTURE, BULK ACOUSTIC WAVE DEVICE, AND MANUFACTURING METHOD THEREOF

(71) Applicant: RichWave Technology Corp., Taipei (TW)

(72) Inventor: Tsyr Shyang Liou, Taipei (TW)

(73) Assignee: RichWave Technology Corp., Taipei (TW)

( * ) Notice: Subject to any disclaimer, the term of this patent is extended or adjusted under 35 U.S.C. 154(b) by 635 days.

(21) Appl. No.: 16/231,621

(22) Filed: Dec. 24, 2018

(65) Prior Publication Data
US 2020/0076397 A1     Mar. 5, 2020

(30) Foreign Application Priority Data
Sep. 5, 2018   (TW) .................... 107131208

(51) Int. Cl.
*H03H 9/02*    (2006.01)
*H03H 9/13*    (2006.01)

(52) U.S. Cl.
CPC ........ *H03H 9/02023* (2013.01); *H03H 9/131* (2013.01)

(58) Field of Classification Search
CPC .... H03H 9/02023; H03H 9/131; H03H 9/175; H03H 9/1007; H03H 9/02015; H03H 9/02086; H03H 2003/025; H03H 3/02
See application file for complete search history.

(56) References Cited

U.S. PATENT DOCUMENTS

| | | | |
|---|---|---|---|
| 7,414,350 B1 | 8/2008 | Barber et al. | |
| 2004/0183400 A1 | 9/2004 | Aigner et al. | |
| 2005/0189846 A1 | 9/2005 | Saito et al. | |
| 2010/0187948 A1 | 7/2010 | Sinha et al. | |
| 2015/0318461 A1 | 11/2015 | Jacobsen et al. | |
| 2015/0349743 A1 | 12/2015 | Burak et al. | |
| 2016/0365842 A1* | 12/2016 | Marksteiner | H03H 9/17 |
| 2018/0175826 A1* | 6/2018 | Sadhu | H03H 9/564 |

(Continued)

FOREIGN PATENT DOCUMENTS

| | | |
|---|---|---|
| CN | 102577115 | 6/2016 |
| CN | 206163483 | 5/2017 |

OTHER PUBLICATIONS

"Office Action of Taiwan Counterpart Application", dated Aug. 28, 2020, p. 1-p. 10.

(Continued)

*Primary Examiner* — Jeffrey M Shin
(74) *Attorney, Agent, or Firm* — JCIPRNET (57) ABSTRACT

A bulk acoustic wave (BAW) structure includes a single crystal piezoelectric material layer, a first electrode, a second electrode and an acoustic reflector. The first and second electrodes are respectively located on a first surface and a second surface of the single crystal piezoelectric material layer. The area of the second electrode is greater than or equal to that of the second surface of the single crystal piezoelectric material layer, and the contact area of the single crystal piezoelectric material layer with the second electrode is equal to the area of the second surface of the single crystal piezoelectric material layer. The acoustic reflector is disposed on a surface of the first electrode.

10 Claims, 7 Drawing Sheets

(56) References Cited

U.S. PATENT DOCUMENTS

2019/0341885 A1* 11/2019 Jackson .................. H01L 24/11

OTHER PUBLICATIONS

"Office Action of Taiwan Counterpart Application," dated Apr. 9, 2019, p. 1-p. 5.
Donald A. Neamen, "Fundamentals of Semiconductor Physics and Devices", 2005, pp. 1-11.
"Office Action of Taiwan Counterpart Application," dated Jan. 9, 2019, p. 1-p. 5.
"Office Action of Taiwan Counterpart Application", dated Apr. 8, 2020, p. 1-p. 7.

* cited by examiner

BULK ACOUSTIC WAVE STRUCTURE, BULK ACOUSTIC WAVE DEVICE, AND MANUFACTURING METHOD THEREOF

CROSS-REFERENCE TO RELATED APPLICATION

This application claims the priority benefit of Taiwan application serial no. 107131208, filed on Sep. 5, 2018. The entirety of the above-mentioned patent application is hereby incorporated by reference herein and made a part of specification.

BACKGROUND

Technical Field

The disclosure relates to a bulk acoustic wave (BAW) structure, a BAW device and a manufacturing method thereof, particularly to a BAW structure having a single crystal piezoelectric material layer, a BAW device, and a manufacturing method thereof.

Description of Related Art

A BAW structure basically includes two metal electrodes sandwiching a piezoelectric material layer. When an electric field is applied to the metal electrodes, the piezoelectric material layer generates an acoustic wave due to vibration, and the acoustic wave oscillates in the piezoelectric material layer to form a standing wave, so as to reduce energy loss.

Since acoustic signals of the BAW structure are transmitted inside a medium, the BAW structure may be small in size and suitable for use in various portable electronic products, such as a bandpass filter for a mobile communication product.

However, when the BAW structure is applied in the bandpass filter, requirements for frequency specifications of the BAW structure are quite strict. For example, due to the manufacturing process, the piezoelectric material layer may be unlikely to grow into a single crystal material, which results in a reduction in a Q value (or quality factor) of the BAW filter, thereby affecting the reliability of the product.

SUMMARY

A BAW structure of the disclosure includes a single crystal piezoelectric material layer, a first electrode, a second electrode and an acoustic reflector. The first electrode and the second electrode are respectively located on a first surface and a second surface of the single crystal piezoelectric material layer, wherein an area of the second electrode is greater than or equal to an area of the second surface of the single crystal piezoelectric material layer, and a contact area of the single crystal piezoelectric material layer with the second electrode is equal to the area of the second surface of the single crystal piezoelectric material layer. The acoustic reflector is disposed on a surface of the first electrode.

A BAW device of the disclosure includes the aforementioned BAW structure, a plurality of bumps, a carrier and a package. The bumps are disposed below the BAW structure and electrically connected to the first electrode and the second electrode respectively. The carrier is electrically connected to the first electrode and the second electrode respectively via the bumps. The package is located on the carrier and encapsulates the BAW structure.

A manufacturing method of a BAW structure of the disclosure includes the following. Firstly, a single crystal substrate is provided. Then, a single crystal piezoelectric material layer is formed on the single crystal substrate, wherein the single crystal piezoelectric material layer has a first surface and a second surface opposing each other, and the second surface is in direct contact with the single crystal substrate. Then, a first electrode is formed on the first surface of the single crystal piezoelectric material layer, and a first acoustic reflector is then formed on a surface of the first electrode. Then, the single crystal substrate is removed, and a second electrode is formed on the second surface of the single crystal piezoelectric material layer, wherein an area of the second electrode is greater than or equal to an area of the second surface of the single crystal piezoelectric material layer, and a contact area of the single crystal piezoelectric material layer with the second electrode is equal to the area of the second surface of the single crystal piezoelectric material layer.

A manufacturing method of a BAW device of the disclosure includes the following. The manufacturing method as described above is performed to form at least one BAW structure. Then, a plurality of bumps is formed below the BAW structure, wherein the bumps are electrically connected to the first electrode and the second electrode respectively of the BAW structure. The BAW structure is flip-chip bonded to a carrier via the bumps. Then, a package is formed on the carrier, and the BAW structure is encapsulated with the package.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Several embodiments are described in detail below with reference to the accompanying drawings. However, the embodiments provided herein are not intended to limit the scope of the disclosure. In addition, the drawings are for illustrative purposes only and are not illustrated according to actual dimensions. To facilitate understanding, the same elements will hereinafter be denoted by the same reference numerals. In addition, terms such as "contain," "include," "have" and the like used herein are all open terms, which mean including but not limited to. Moreover, directional terms mentioned herein, such as "on" and "below," are only directions relative to the drawings. Therefore, the directional terms are used to illustrate rather than limit the disclosure.

Figure 1:
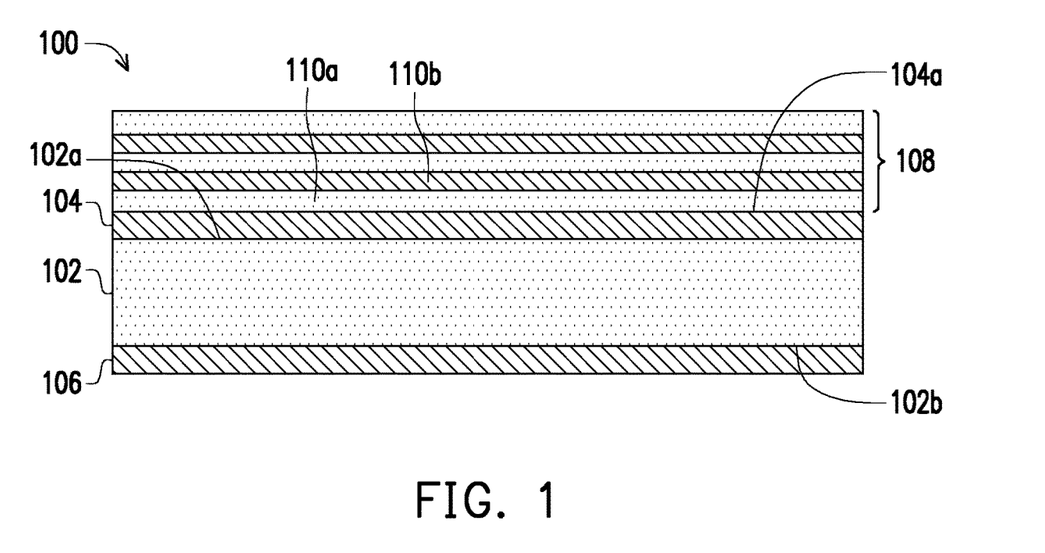
FIG. 1 is a schematic view of a BAW structure according to a first embodiment of the disclosure.

FIG. 1 is a schematic view of a BAW structure according to a first embodiment of the disclosure.

Referring to FIG. 1, a BAW structure 100 of the first embodiment includes a single crystal piezoelectric material layer 102, a first electrode 104, a second electrode 106, and a first acoustic reflector 108, wherein a material of the single crystal piezoelectric material layer 102 includes, for example, aluminum nitride, $LiTaO_3$, $LiNbO_3$, quartz or diamond. In an embodiment, a thickness of the single crystal piezoelectric material layer 102 is, for example, between 100 nm and 200 nm. The first electrode 104 and the second electrode 106 are respectively located on a first surface 102a and a second surface 102b of the single crystal piezoelectric material layer 102, wherein materials of the first electrode 104 and the second electrode 106 each independently include molybdenum (Mo), tungsten (W), ruthenium (Ru), tantalum (Ta), platinum (Pt), titanium (Ti), gold (Au) or aluminum (Al). The acoustic reflector 108 is disposed on a surface 104a of the first electrode 104. The first acoustic reflector 108 includes a first sublayer 110a and a second sublayer 110b that are alternately stacked, and is, for example, a Bragg reflector, wherein the first sublayer 110a and the second sublayer 110b are respectively materials having different impedances (Z). In addition, metal materials, dielectric materials or semiconductor materials having different impedances may be applied to the first sublayer 110a and the second sublayer 110b of the first acoustic reflector 108. In another embodiment, different types of materials may also be used in combination as the first sublayer 110a and the second sublayer 110b of the first acoustic reflector 108. They include, for example, alternately stacked metal/dielectric materials, alternately stacked metal/semiconductor materials, alternately stacked dielectric/semiconductor materials, and so on. In the case of alternately stacked metal/dielectric materials, the material of the first sublayer 110a includes, for example, silicon oxide ($SiO_2$), and the material of the second sublayer 110b includes, for example, molybdenum (Mo).

Referring still to FIG. 1, the BAW structure 100 of the present embodiment has no substrate. Thus, a contact area of the single crystal piezoelectric material layer 102 with the second electrode 106 is equal to an area of the second surface 102b of the single crystal piezoelectric material layer 102, and an area of the second electrode 106 should be greater than or equal to the area of the second surface 102b of the single crystal piezoelectric material layer 102, so as to facilitate circuit design. In FIG. 1 as an example, the area of the second electrode 106 is equal to the area of the second surface 102b of the single crystal piezoelectric material layer 102. However, in practice, the second electrode 106 may extend beyond an edge of the single crystal piezoelectric material layer 102.

Figure 2:
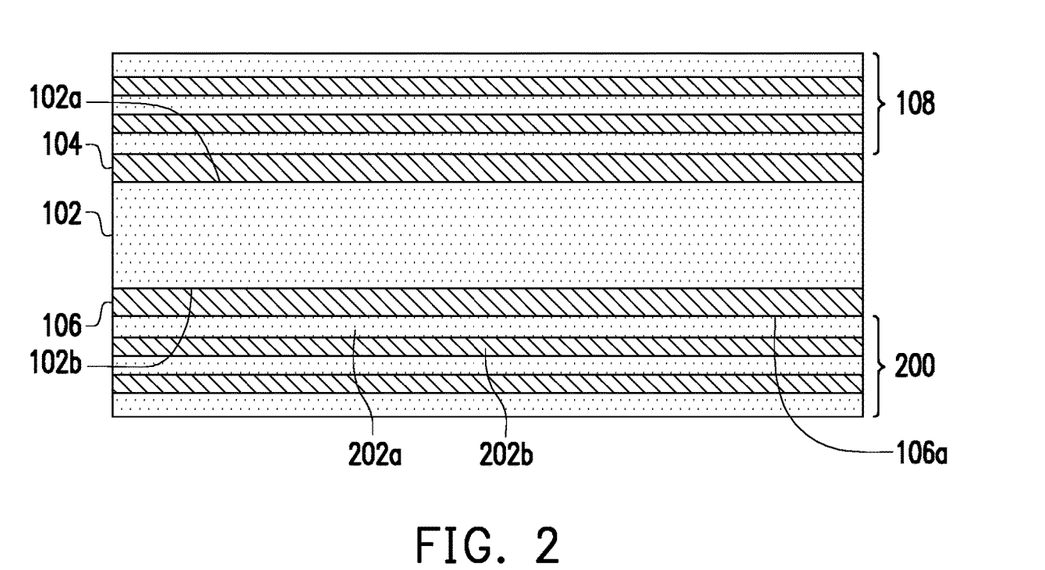
FIG. 2 is a schematic view of another BAW structure of the first embodiment.

FIG. 2 is a schematic view of another BAW structure of the first embodiment, wherein the reference numerals in FIG. 1 are used to denote the same components.

In FIG. 2, in addition to the single crystal piezoelectric material layer 102, the first electrode 104, the second electrode 106 and the first acoustic reflector 108, a second acoustic reflector 200 is further disposed on a surface 106a of the second electrode 106. The second acoustic reflector 200 includes a first sublayer 202a and a second sublayer 202b that are alternately stacked, wherein the choice of materials of the first sublayer 202a and the second sublayer 202b may refer to the first sublayer 110a and the second sublayer 110b of the first acoustic reflector 108, and description thereof is thus omitted. In addition, the first sublayers 110a and 202a in the second acoustic reflector 200 and the first acoustic reflector 108 may be the same or different materials, and the second sublayers 110b and 202b in the second acoustic reflector 200 and the first acoustic reflector 108 may be the same or different materials. In view of simplifying the manufacturing process, the first sublayers 110a and 202a are preferably the same material, and the second sublayers 110b and 202b are preferably the same material.

Figure 3:
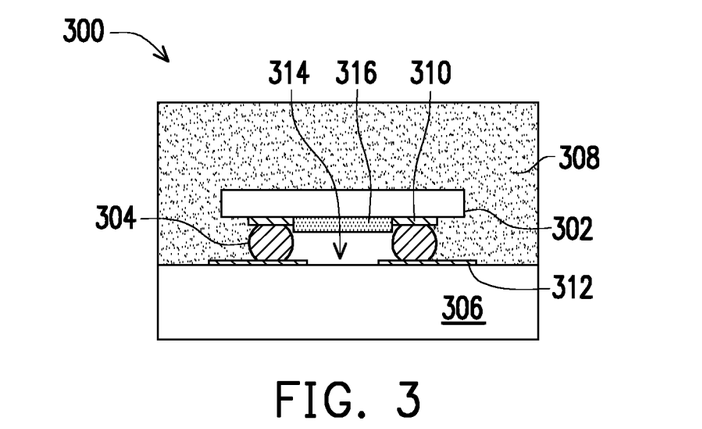
FIG. 3 is a schematic view of a BAW device according to a second embodiment of the disclosure.

FIG. 3 is a schematic view of a BAW device according to a second embodiment of the disclosure.

Figure 4:
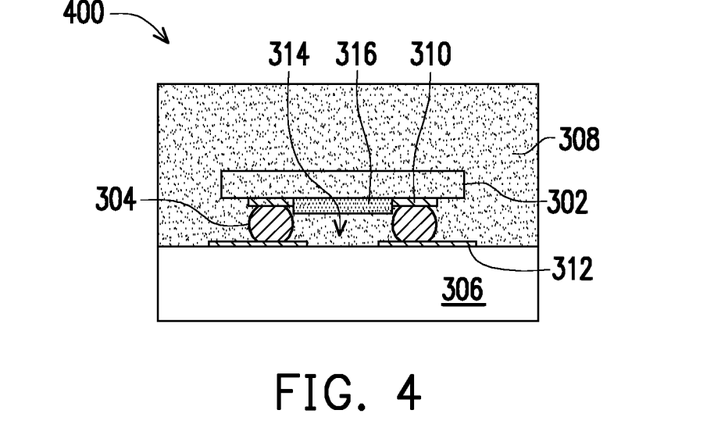
FIG. 4 is a schematic view of another BAW device of the second embodiment.

Referring to FIG. 3, a BAW device 300 of the second embodiment includes a BAW structure 302, a plurality of bumps 304, a carrier 306, and a package 308. The BAW structure 302 may be the BAW structure of the first embodiment, the bumps 304 are disposed below the BAW structure 302, and the bumps 304 are electrically connected to a first electrode (not illustrated) and a second electrode (not illustrated) respectively within the BAW structure 302. Although the first and second electrodes are not shown in FIG. 3, it should be understood that the first and second electrodes can be connected to the same surface of the BAW structure 302 by current technology, and then packaged by flip chip. For example, a contact pad 310 may be formed first, the bumps 304 are formed on the contact pad 310, then the bumps 304 face a contact pad 312 of the carrier 306, and the bumps 304 are then remelted (e.g., by hot air reflow soldering), such that the contact pad 312 of the carrier 306 is electrically connected to the first and second electrodes respectively via the bumps 304. The carrier 306 is, for example, a lead frame, a substrate or a printed circuit board. The package 308 is located on the carrier 306 and encapsulates the BAW structure 302. In general, a gap 314 is formed between the carrier 306 and the BAW structure 302, and thus the gap 314 is unfilled by the package 308. Alternatively, as shown in FIG. 4, the gap 314 is filled with the package 308 in the BAW device 400. If the package 308 does not completely fill the gap 314, the BAW structure of FIG. 1 or FIG. 2 may be used, and the BAW structure of FIG. 1 which has an acoustic reflector on a single surface is preferred. If the package 308 fills up the gap 314, it is more suitable to use the BAW structure of FIG. 2 which has an acoustic reflector on both surfaces. In addition, a passivation layer 316 may be provided as a protective layer on the BAW structure 302, and a material thereof includes, for example, silicon oxide ($SiO_2$) or a corrosion-resistant polymer.

FIGS. 5A to 5F are schematic cross-sectional views of a manufacturing process of a BAW structure according to a third embodiment of the disclosure.

Figure 5A:
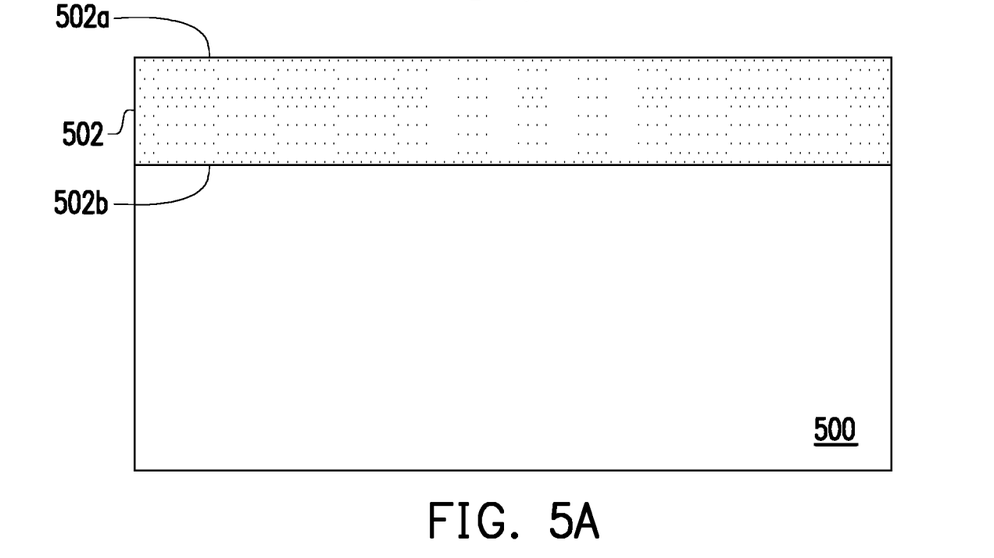
FIGS. 5A to 5F are schematic cross-sectional views of a manufacturing process of a BAW structure according to a third embodiment of the disclosure.

Referring first to FIG. 5A, in the manufacturing method of the third embodiment, a single crystal substrate 500 is provided first, and a material thereof includes, for example, zinc oxide, silicon carbide or silicon. A single crystal piezoelectric material layer 502 is formed on the single crystal substrate 500 by, for example, single crystal epitaxy. Due to the structure property of the single crystal substrate 500 itself, it is ensured that a piezoelectric material grown therefrom is also single crystal, and thereby a Q value of the subsequently formed BAW structure is improved. The single crystal piezoelectric material layer 502 has a first surface 502a and a second surface 502b opposing each other, and the second surface 502b is in direct contact with the single crystal substrate 500.

Referring still to FIG. 5A, a material of the single crystal piezoelectric material layer 502 includes, for example, aluminum nitride, LiTaO$_3$, LiNbO$_3$, quartz or diamond. From the viewpoint of manufacturing process control, There should be a high etching selectivity ratio between the single crystal substrate 500 and the single crystal piezoelectric material layer 502, for example, greater than 10:1, preferably greater than 20:1. For example, if the material of the single crystal substrate 500 is zinc oxide, the material of the single crystal piezoelectric material layer 502 may be aluminum nitride, but the disclosure is not limited thereto.

Figure 5B:
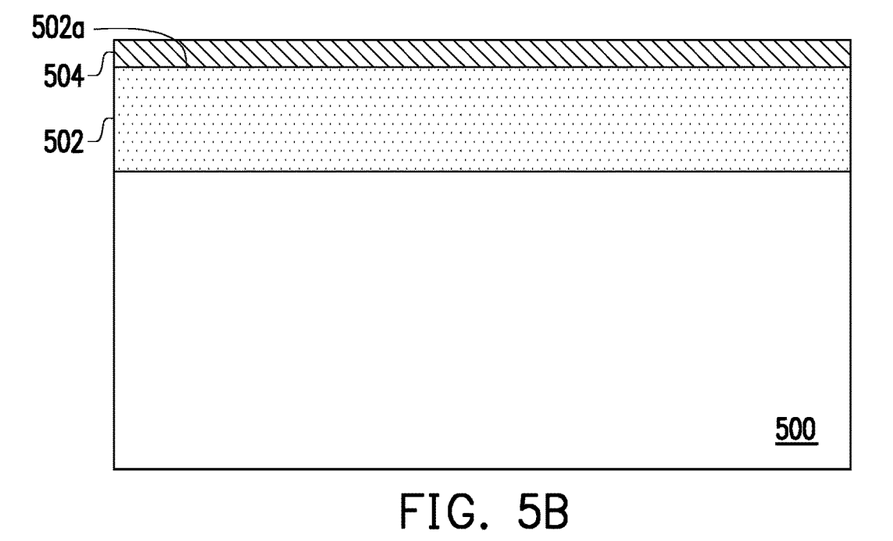

Then, referring to FIG. 5B, a first electrode 504 is formed on the first surface 502a of the single crystal piezoelectric material layer 502. A method of forming the first electrode 504 is, for example, sputtering or other suitable method. The choice of the material of the first electrode 504 may refer to the first electrode 104 in the first embodiment, and description thereof is thus omitted.

Figure 5C:
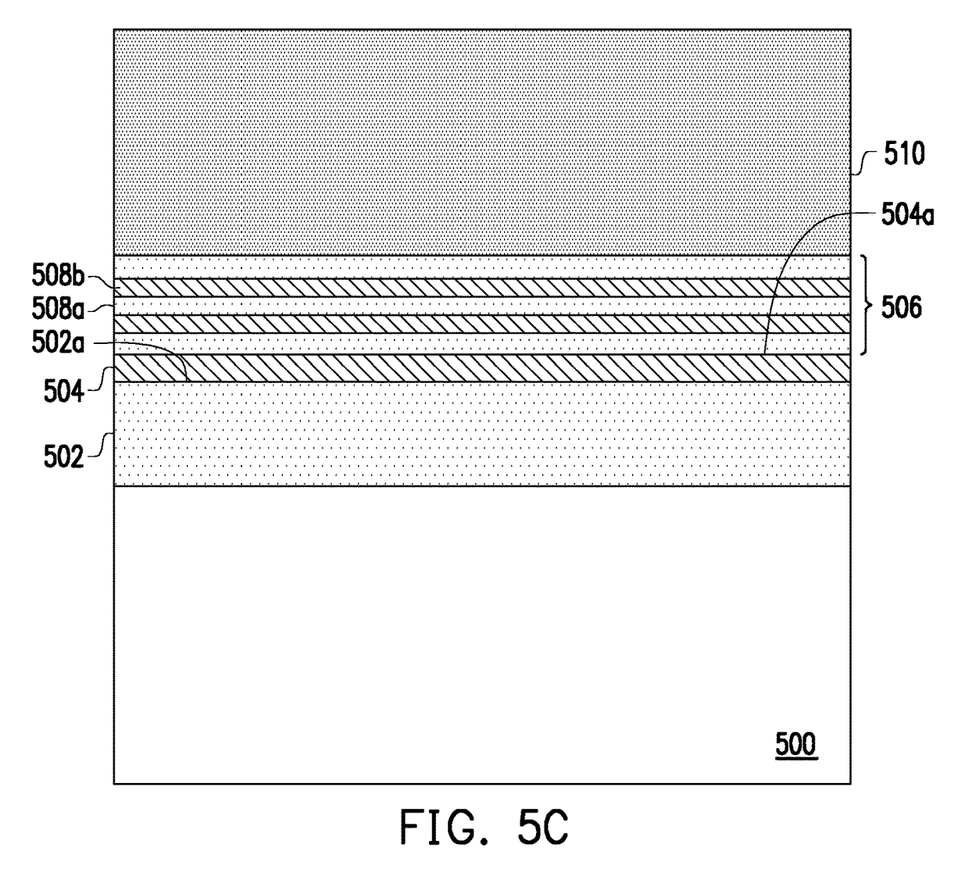

Thereafter, referring to FIG. 5C, a first acoustic reflector 506 is formed on a surface 504a of the first electrode 504. The first acoustic reflector 506 is formed by, for example, alternately depositing a first sublayer 508a and a second sublayer 508b, wherein the choice of materials of the first sublayer 508a and the second sublayer 508b may refer to the first sublayer 110a and the second sublayer 110b of the first acoustic reflector 108 in the first embodiment, and description thereof is thus omitted.

Figure 5D:
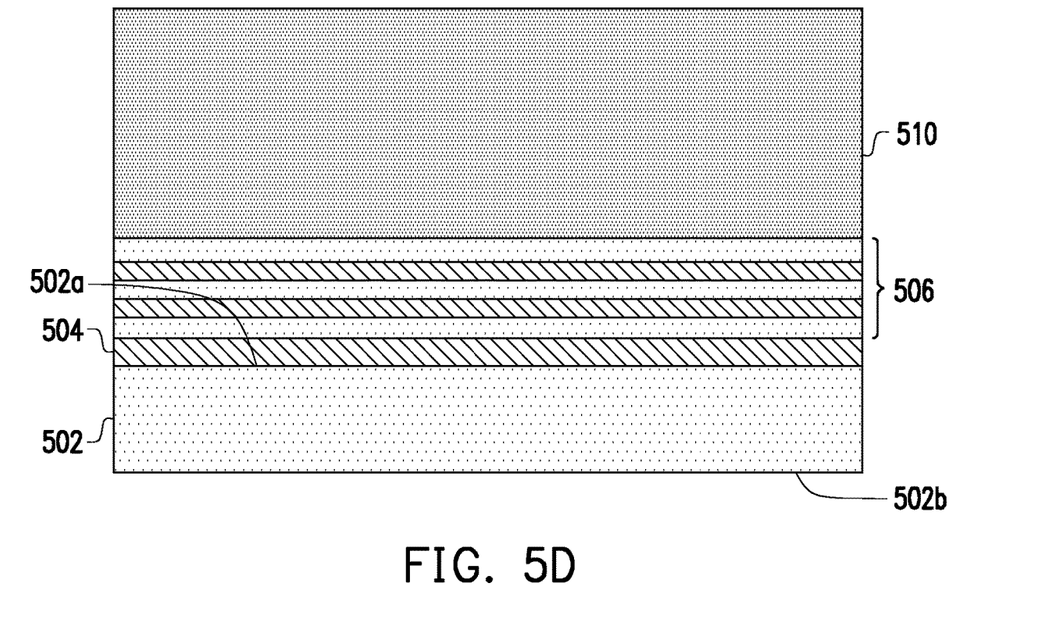

Next, the single crystal substrate 500 is removed to obtain a structure as shown in FIG. 5D. A method of removing the single crystal substrate 500 is, for example, wet etching. If zinc oxide is used as the material of the single crystal substrate 500, sulfur hexafluoride (SF$_6$) or citric acid may be used as an etchant. Moreover, to protect the first acoustic reflector 506, a passivation layer 510 may be formed on the first acoustic reflector 506 before the single crystal substrate 500 is removed. The choice of material of the passivation layer 510 may refer to the passivation layer 316 in the second embodiment, and description thereof is thus omitted.

Figure 5E:
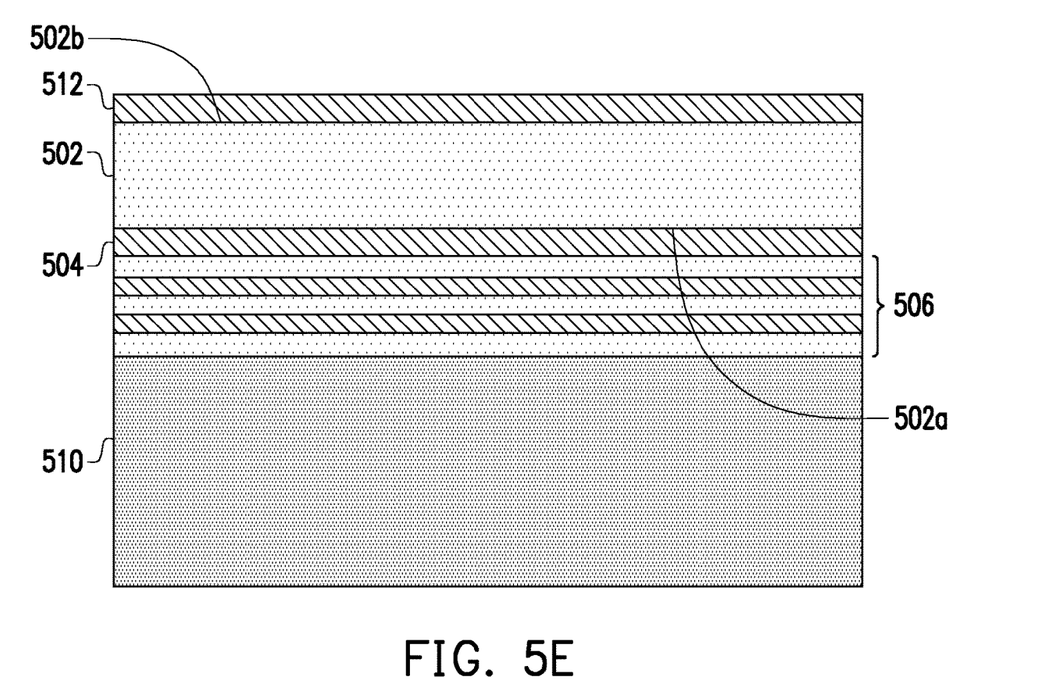

Referring then to FIG. 5E, the structure in FIG. 5D is inverted and a second electrode 512 is formed on the second surface 502b of the single crystal piezoelectric material layer 502, wherein an area of the second electrode 512 is greater than or equal to an area of the second surface 502b of the single crystal piezoelectric material layer 502, and a contact area of the single crystal piezoelectric material layer 502 with the second electrode 512 is equal to the area of the second surface 502b of the single crystal piezoelectric material layer 502. A method of forming the second electrode 512 may refer to the method of forming the first electrode 504; the choice of material of the second electrode 512 may refer to the second electrode 106 in the first embodiment, and description thereof is thus omitted.

Basically, by performing the steps of FIGS. 5A to 5E, a BAW structure having an acoustic reflector on a single surface can be completed. If a BAW structure having an acoustic reflector on both surfaces needs to be manufactured, the step of FIG. 5F may be performed subsequently. A second acoustic reflector 514 is formed on a surface 512a of the second electrode 512, wherein the second acoustic reflector 514 is formed in the same manner as the first acoustic reflector 506, and the choice of materials of a first sublayer 516a and a second sublayer 516b in the second acoustic reflector 514 may refer to the first sublayer 110a and the second sublayer 110b of the first acoustic reflector 108 in the first embodiment, and description thereof is thus omitted. Finally, another passivation layer 518 may be formed on the second acoustic reflector 514. The choice of material of the passivation layer 518 may refer to the passivation layer 510, and description thereof is thus omitted.

FIGS. 6A to 6D are schematic cross-sectional views of a manufacturing process of a BAW device according to a fourth embodiment of the disclosure.

Figure 6A:
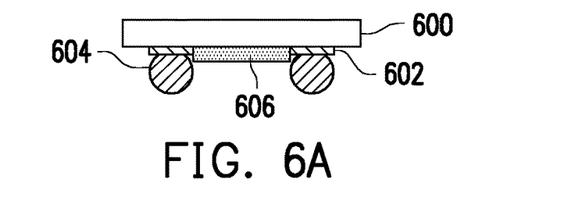
FIGS. 6A to 6D are schematic cross-sectional views of a manufacturing process of a BAW device according to a fourth embodiment of the disclosure.

Referring first to FIG. 6A, at least one BAW structure 600 is formed, and a manufacturing method of the BAW structure 600 may refer to the third embodiment, and description thereof is thus omitted. A contact pad 602 may be formed below the BAW structure 600, and then a plurality of bumps 604 are formed on the contact pad 602. The bumps 604 are electrically connected to first and second electrodes (not illustrated) respectively of the BAW structure 600 via the contact pad 602. Although the first and second electrodes are not shown in FIG. 6A, it should be understood that the first and second electrodes can be pulled to the same surface of the BAW structure 600 by the related art, and the contact pad 602 and the bumps 604 are then formed on the above surface. In addition, before the contact pad 602 is formed, a passivation layer 606 may be formed as a protective layer on a surface of the BAW structure 600. The choice of material of the passivation layer 606 may refer to the passivation layer 316 in the second embodiment, and description thereof is thus omitted.

Figure 6B:
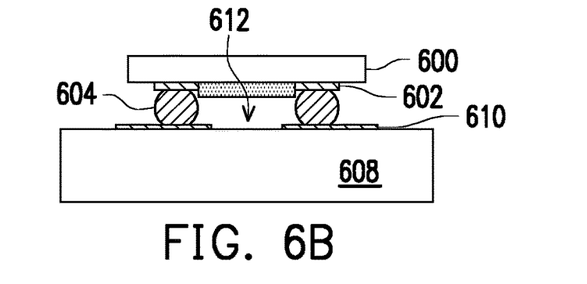

Then, referring to FIG. 6B, the BAW structure 600 is flip-chip bonded to a carrier 608 via the bumps 604. A surface of the carrier 608 with respect to the bumps 604 has a contact pad 610 thereon. A gap 612 is formed between the carrier 608 and the BAW structure 600 after bonding. The flip-chip bonding is performed by, for example, aligning the bumps 604 with the contact pad 610 of the carrier 608, and then remelting the bumps 604 (e.g., by hot air reflow soldering). Thus, the carrier 608 is bonded to the bumps 604 and electrically connected to the first and second electrodes respectively via the bumps 604. The carrier 608 may refer to the carrier 306 of the second embodiment, and description thereof is thus omitted.

Figure 6C:
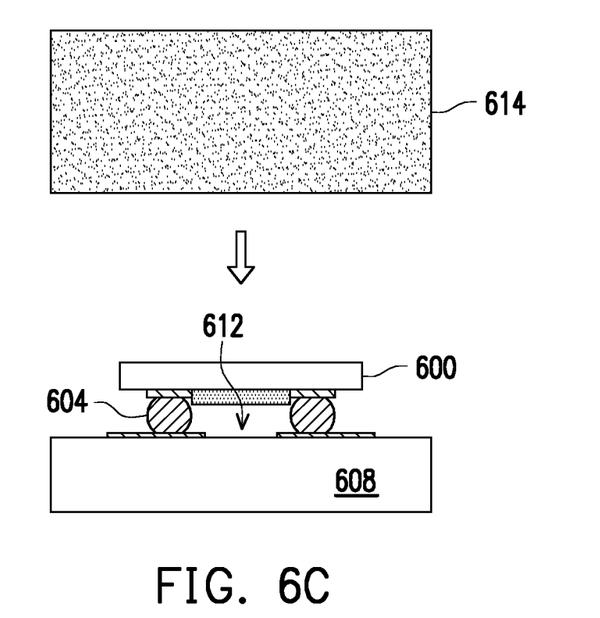

Next, referring to FIG. 6C, a solid-state package 614 may be pressed against the BAW structure 600 by heating and pressurization in order to perform packaging.

Figure 6D:
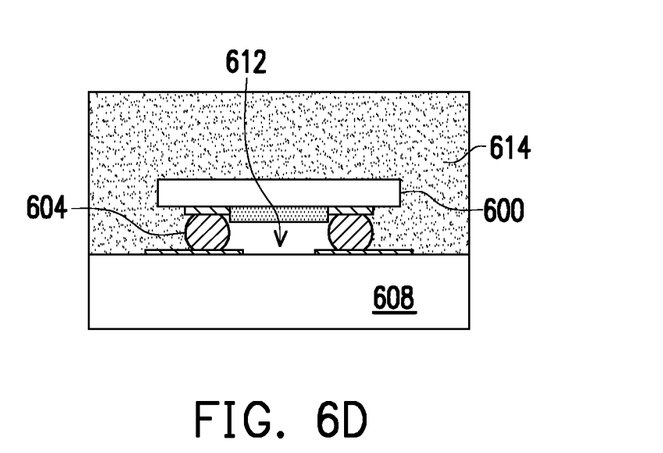

Thereafter, referring to FIG. 6D, in a packaged BAW device, since the package 614 is solid-state, the gap 612 is not filled and a cavity is formed for sound wave reflection. Therefore, the manufacturing method of the BAW device of the present embodiment preferably uses a BAW structure having an acoustic reflector on a single surface (as shown in FIG. 5E).

Figure 7A:
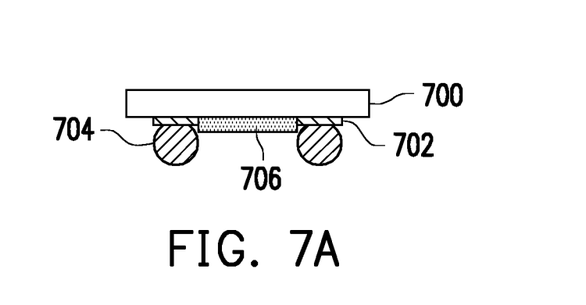
FIGS. 7A to 7C are schematic cross-sectional views of a manufacturing process of a BAW device according to a fifth embodiment of the disclosure.
Figures 7B, 7C:
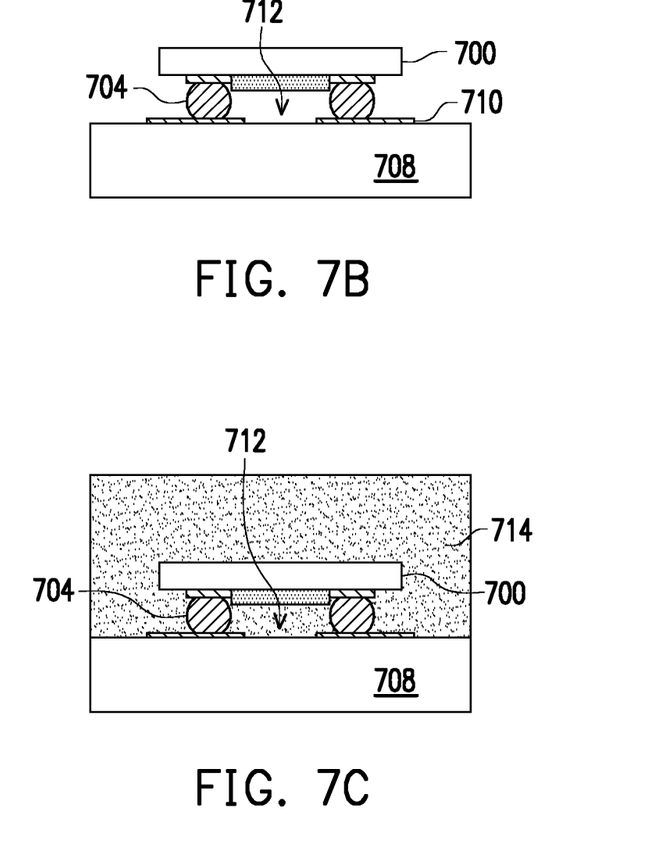

FIGS. 7A to 7C are schematic cross-sectional views of a manufacturing process of a BAW device according to a fifth embodiment of the disclosure.

Referring first to FIG. 7A, at least one BAW structure 700 is formed, and a manufacturing method of the BAW structure 700 may refer to the third embodiment, and description thereof is thus omitted. A plurality of contact pads 702 are formed below the BAW structure 700, and then a plurality of bumps 704 is formed on the contact pads 702. The bumps 704 are electrically connected to first and second electrodes (not illustrated) respectively of the BAW structure 700. In addition, before the contact pads 702 are formed, a passivation layer 706 may be formed as a protective layer on a surface of the BAW structure 700. The choice of material of the passivation layer 706 may refer to the passivation layer 316 in the second embodiment, and description thereof is thus omitted.

Then, referring to FIG. 7B, the BAW structure 700 is flip-chip bonded to a contact pad 710 of a carrier 608 via the bumps 704. A gap 712 is formed between the carrier 708 and the BAW structure 700. The flip-chip bonding may refer to the fourth embodiment, and description thereof is thus omitted. The carrier 708 may refer to the carrier 306 of the second embodiment, and description thereof is thus omitted.

Figure 5F:
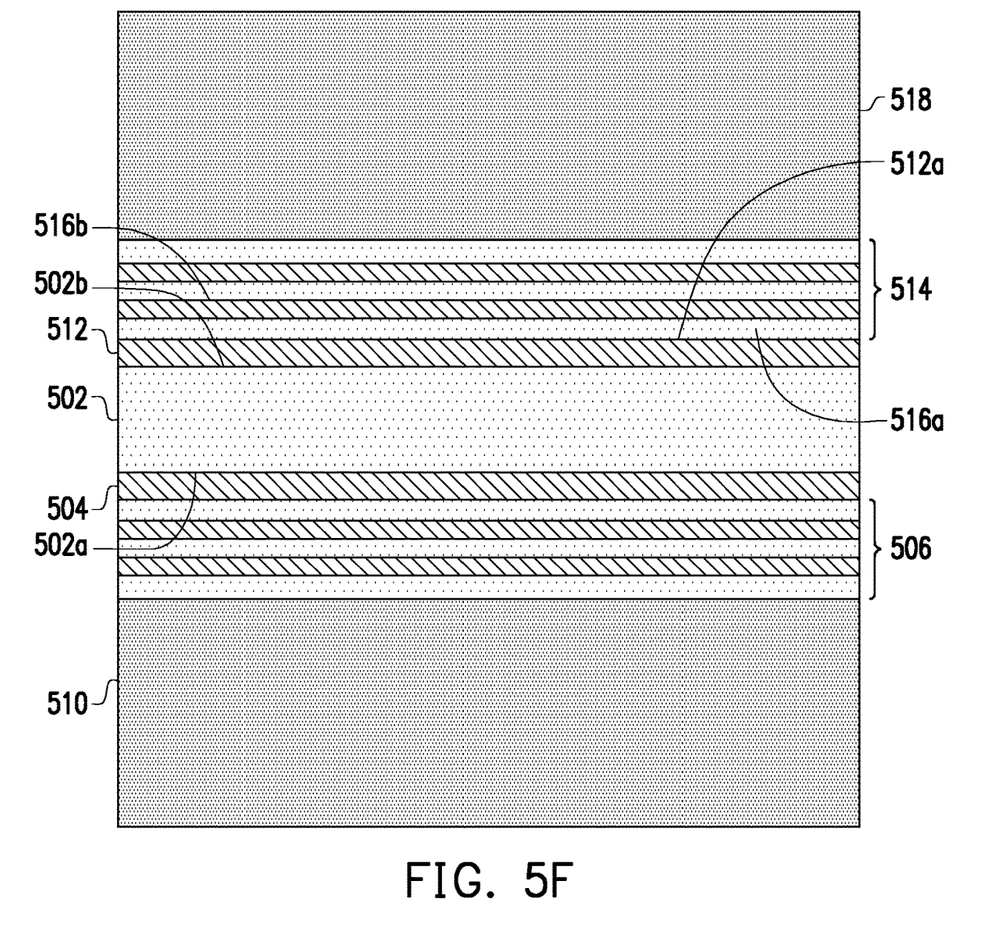

Next, referring to FIG. 7C, packaging may be performed by glue injection using a colloidal state packaging material, thus forming a package 714 on the carrier 708, and the package 714 encapsulates the BAW structure 700. Compared with FIG. 6D, since the gap 712 is filled, it cannot be used as a cavity for sound wave reflection. Due to the use of the colloidal state packaging material, the package 714 fills up the gap 712. Therefore, the manufacturing method of the BAW device of the present embodiment preferably uses a BAW structure having an acoustic reflector on both surfaces (as shown in FIG. 5F).

Figure 8:
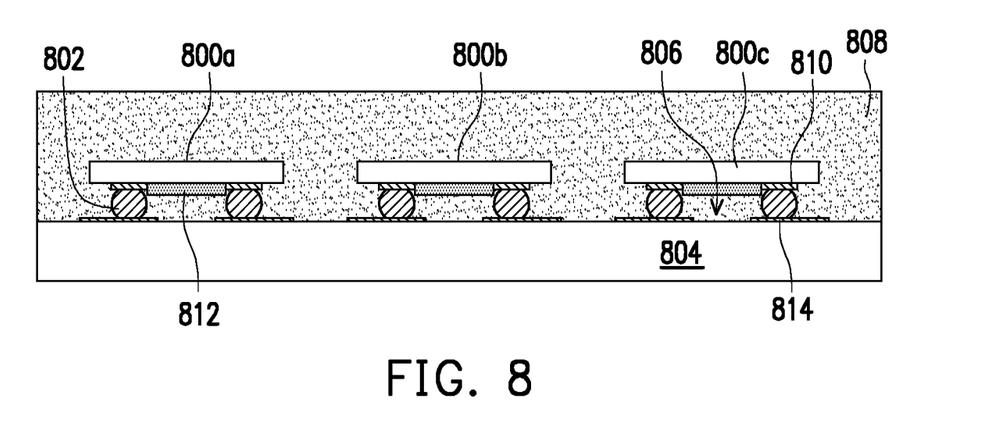
FIG. 8 is a schematic view of a BAW device according to a sixth embodiment of the disclosure.

FIG. 8 is a schematic view of a BAW device according to a sixth embodiment of the disclosure.

Referring to FIG. 8, a BAW device of the sixth embodiment at least includes a plurality of BAW structures 800a to 800c connected to each other in series, a plurality of bumps 802, a carrier 804 and a package 808. Basically, the bumps 802, the carrier 804 and the package 808 may all be deduced with reference to the second embodiment, and description thereof is thus omitted. In addition, the BAW structures 800a to 800c may further have a contact pad 810 and a passivation layer 812, and the carrier 804 may further have a contact pad 814. The BAW structures 800a to 800c may have different filtering effects for different bands (frequencies), and therefore, the BAW device of the present embodiment may be applied for different frequency ranges. Although FIG. 8 shows three BAW structures 800a to 800c, the disclosure is not limited thereto, and the number of BAW structures may be increased or decreased as needed.

Moreover, the BAW device as shown in FIG. 8 can also be manufactured by the method of the fourth embodiment or the fifth embodiment. For example, in the flip-chip bonding step of FIG. 6B or FIG. 7B, the BAW structures 800a to 800c may all be bonded to the carrier 804, and the carrier 804 is electrically connected to first and second electrodes (not illustrated) respectively of each of the BAW structures 800a, 800b and 800c via the bumps 802. The second electrodes of the BAW structures 800a, 800b and 800c may be connected to each other through leads in the carrier 804 to form a common electrode (not illustrated), and different voltages are applied to the first electrodes of the BAW structures 800a, 800b and 800c, so as to achieve the application in different frequency ranges. In addition, although FIG. 8 shows that the package 808 fills up the gap 806, the package 808 may not completely fill the gap 806.

In summary, in the disclosure, a single crystal piezoelectric material layer is formed on a single crystal substrate. Therefore, the Q value of the BAW structure is effectively improved, and the thus obtained BAW structure has no substrate, and the need for miniaturized products can thus be met in terms of structural size (thickness). Also, with a specific package structure, the disclosure can be used as a BAW device (such as a filter). In addition, if BAW structures with different filtering frequencies are disposed in the same BAW device, the application for different frequency ranges can be performed.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A manufacturing method of a bulk acoustic wave structure, comprising:
    providing a single crystal substrate;
    forming a single crystal piezoelectric material layer on the single crystal substrate, wherein the single crystal piezoelectric material layer has a first surface and a second surface opposing each other, and the second surface is in direct contact with the single crystal substrate;
    forming a first electrode on the first surface of the single crystal piezoelectric material layer;
    forming a first acoustic reflector on a surface of the first electrode;
    removing the single crystal substrate; and
    forming a second electrode on the second surface of the single crystal piezoelectric material layer, wherein an area of the second electrode is greater than or equal to an area of the second surface of the single crystal piezoelectric material layer, and a contact area of the single crystal piezoelectric material layer with the second electrode is equal to the area of the second surface of the single crystal piezoelectric material layer.

2. The manufacturing method of a bulk acoustic wave structure according to claim 1, wherein an etching selectivity of the single crystal substrate to the single crystal piezoelectric material layer is greater than 10:1.

3. The manufacturing method of a bulk acoustic wave structure according to claim 1, wherein a material of the single crystal substrate comprises zinc oxide, silicon carbide or silicon.

4. The manufacturing method of a bulk acoustic wave structure according to claim 1, wherein a material of the single crystal piezoelectric material layer comprises aluminum nitride, $LiTaO_3$, $LiNbO_3$, quartz or diamond.

5. The manufacturing method of a bulk acoustic wave structure according to claim 1, further comprising forming a second acoustic reflector on a surface of the second electrode after forming the second electrode.

6. A manufacturing method of a bulk acoustic wave device, comprising:
    performing the manufacturing method according to claim 1 to form at least one bulk acoustic wave structure;
    forming a plurality of bumps below the bulk acoustic wave structure, wherein the bumps are electrically connected to the first electrode and the second electrode respectively of the bulk acoustic wave structure;
    flip-chip bonding the bulk acoustic wave structure to a carrier via the bumps; and
    forming a package on the carrier and encapsulating the bulk acoustic wave structure with the package.

7. The manufacturing method of a bulk acoustic wave device according to claim 6, wherein a gap is formed between the carrier and the bulk acoustic wave structure.

8. The manufacturing method of a bulk acoustic wave device according to claim 7, wherein the package does not completely fill the gap.

9. The manufacturing method of a bulk acoustic wave device according to claim 7, wherein the package fills up the gap.

10. The manufacturing method of a bulk acoustic wave device according to claim 6, wherein forming the bulk acoustic wave structure comprises: forming a plurality of the bulk acoustic wave structures connected in series; and in the step of flip-chip bonding, bonding the bulk acoustic wave structures to the carrier.

\* \* \* \* \*